United States Patent [19]
Irving

[11] 3,987,401
[45] Oct. 19, 1976

[54] INDICATING SYSTEM USING MULTICOLOR LIGHT EMITTING DIODES

[75] Inventor: Charles Richard Irving, Elmhurst, Ill.

[73] Assignee: Motorola, Inc., Schaumburg, Ill.

[22] Filed: Dec. 31, 1974

[21] Appl. No.: 537,729

[52] U.S. Cl. .................. 325/455; 116/124.1 R; 334/36
[51] Int. Cl.² ................................ H04B 1/06
[58] Field of Search ........... 325/360, 364, 455, 398; 334/86, 87, 36; 179/15 BT; 116/124.1 R, 124.4; 315/129–133, 136; 340/332, 336, 366 R

[56] References Cited
UNITED STATES PATENTS

| | | | |
|---|---|---|---|
| 2,019,882 | 11/1935 | West | 116/124.1 R |
| 2,120,136 | 6/1938 | Lyman | 116/124.1 R |
| 2,528,214 | 10/1950 | Dome | 325/455 |
| 3,319,004 | 5/1967 | Avins | 325/455 |
| 3,388,220 | 6/1968 | Houshi | 179/15 BT |
| 3,530,501 | 9/1970 | Von Benschoten | 315/132 |
| 3,594,776 | 7/1971 | Wildgruber | 340/332 |
| 3,732,498 | 5/1973 | Beckman et al. | 325/455 |
| 3,840,873 | 10/1974 | Usui | 340/336 |
| 3,873,979 | 3/1975 | Craford et al. | 340/366 R |
| 3,882,399 | 5/1975 | Karpowycz et al. | 325/455 |

*Primary Examiner*—Robert L. Griffin
*Assistant Examiner*—Jin F. Ng
*Attorney, Agent, or Firm*—James W. Gillman; Donald J. Lisa

[57] ABSTRACT

An indicating system for a radio receiver is formed of an indicator and associated control circuitry. The indicator is comprised of two emitting diodes wired in parallel and in reverse polarity, and encapsulated in a translucent package. Each diode in an indicator emits light of a visibly distinct wavelength when energized. The control circuitry causes a change in polarity of bias voltage applied to the indicator, and, in so doing a change in color of the indicator. With appropriate control circuitry, the color of the indicator indicates whether the receiver is tuned to an AM or FM station, or whether the station is broadcasting in mono or stereo. The indicator can be mounted to the dial pointer causing a change in pointer color with a change in receiver function. Additionally, the amount of current through the light emitting diodes and thus the intensity of emitted light may be varied in accordance with a parameter variation as, for example, accuracy of receiver tuning.

18 Claims, 6 Drawing Figures

INDICATING SYSTEM USING MULTICOLOR LIGHT EMITTING DIODES

FIELD OF THE INVENTION

This invention relates to visual indicating systems and particularly to such systems for displaying radio receiver operating modes or parameters.

BACKGROUND

As increasing numbers of user functions are incorporated into radio receivers, the complexities of indicating systems have multiplied. Conventional receivers are cluttered with an array of knobs, lights, and meters the interpretation of which is essential to proper receiver use. While knob type indicators are cheap to manufacture they are difficult to read and generally require an external source of illumination for user identification. Conversely, lights and meters are easy to see but are often expensive as extensive associated circuitry must be employed. Finally, a clutter of indicators detracts from the aesthetics of the receiver appearance.

One approach to indicator simplification has been to incorporate a multiplicity of readouts into one indicator. For example, Japan Industries Limited in their receiver model 601M25, coupled a red light emitting diode to the dial scale pointer. Not only does the pointer indicate the frequency to which the receiver is tuned, but it also changes in emitted light intensity dependent on whether the received station is broadcasting in monophony or stereophony.

Light emitting diodes are replacing light bulbs in modern indicating systems. These diodes are known for their long life and, as manufacturers develop LED's of various colors, will prove ideal as indicators. One manufacturer, Monsanto, sells a part (part no. MV5491) having a red and a green LED in the same translucent package. The LED's are wired in parallel and reverse polarity oriented. When current flows through the part in one direction it emits red light, green light being emitted with a reverse current flow. This is one of many parts which is the product of a modern technology and which would be ideally suited in a variety of indicator applications.

SUMMARY OF THE INVENTION

It is a purpose of the present invention, therefore, to provide an indicating system which is easy to understand and simple to use.

It is a further purpose of the invention to provide an indicating system which is inexpensive to manufacture yet reliable in service.

A further purpose of the invention is to provide an indicating system of the above type, for use in combination with a radio receiver, which enhances the appearance of the receiver.

Another object of the present invention is to provide control circuitry for adapting multicolor light emitting diode arrays to a variety of end use indicating systems.

An indicating system, according to the invention, includes an indicator having first and second light emitting diodes. Upon activation, each diode emits light of a different color. The diodes are wired in parallel such that the polarity of the first diode is opposite the polarity of the second. The common connecting points of the diodes comprise first and second terminals. Due to the described indicator structure, the direction of current from one terminal to the next determines which of the two diodes is activated.

A power supply, having first and second contacts, is suitable for activating the diodes. The supply's second contact connects to a reference potential, as, for example, circuit ground. First and second current legs connect between the reference potential and the first and second terminals, respectively.

In combination therewith, a control circuit, operable in a first or second state, completes a circuit from the power supply's first contact through the first diode and the first current leg to the reference potential when the circuit is in its first state. Alternatively, the control circuit completes a circuit from the power supply's first contact through the second diode and the second leg to the reference potential when in its second state.

In this manner, the color emitted by the indicator is representative of the state of the control circuitry.

Further disclosed is control circuitry suitable to cause the intensity of emitted light to correspond to accuracy of tuning.

Additionally disclosed is means for joining an indicator in optical configuration with the dial scale pointer of the radio receiver.

DESCRIPTION OF THE DRAWINGS

The invention is better understood with reference to the drawings in which.

DETAILED DESCRIPTIONS OF THE PREFERRED EMBODIMENTS OF THE INVENTION

Figure 1:
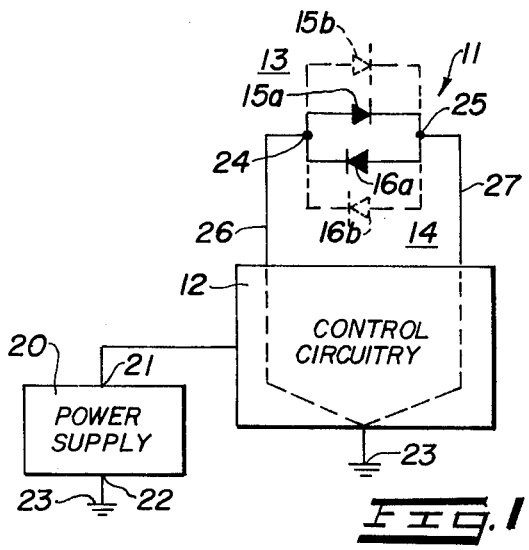
FIG. 1 depicts a generalized indicating system.

In FIG. 1 a generalized indicating system 10 is comprised of an indicator 11, associated control circuitry 12, and a power supply 20. The indicator 11 has a first light emitting diode 15a and a second light emitting diode 16a. Each diode 15a, 16a emits light of a different color upon activation. The diodes are wired in parallel such that the polarity of the first diode 15a is opposite the polarity of the second diode 16a. The common connecting points of the diodes comprise a first terminal 24 and a second terminal 25. Shown in dotted lines is a third diode 15b and a fourth diode 16b. The third diode 15b is wired in parallel, and in the same electrical orientation, as diode 15a. Similarly, diode 16b is wired in parallel, and with the same electrical orientation, as second diode 16a. The diode pair 15a, 15b comprise a first array 13 whereas the diodes 16a, 16b comprise a second array 14. The color emitting characteristic of third and fourth diodes 15b, 16b are chosen such that the first array 13 emits light of a color distinctly different from that of the second array 14. As should be clear from the drawing, the direction of current flow between terminals 24 and 25 determines which of the two diodes 15a, 16a or diode arrays 13, 14 becomes activated. While an array is shown as comprising two diodes, it should be clear that any number of diodes could be included in each array.

The power supply 20 has a first contact 21 and a second contact 22. The second contact 22 is connected to a reference potential 23. A first current leg 26 is shown connected from terminal 24 through the control circuitry 12 to the power supply 20 first terminal 21. The second current leg 27 connects the second terminal 25 also through the control circuitry 12 to the power supply first terminal 21.

The control circuitry, which also connects to the reference, or ground potential 23, is operable in a first or a second state. In its first state the circuitry 12 completes a current path from the power supply first contact 20 through the first diode 15a (and array 13) back to the reference potential 23. When in its second state, the control circuitry 12 completes a current path from the power supply first contact through the second diode 16a (and second array 14) to the reference potential.

In operation, since the state of the control circuitry 12 determines the path of current through the indicator 11, it should be apparent that the color emitted by the indicator is representative of the state of the control circuitry. Thus, following this generalized format, any number of control circuits can be devised whose status is indicated by the indicating system according to the invention.

Figure 2:
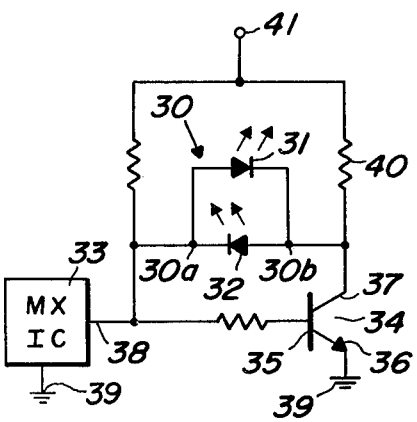
FIG. 2 illustrates a two light emitting diode indicator in a Stereo/Mono indicating system.

In FIG. 2 a two array indicator is shown in electrical configuration with associated control circuitry, the resultant system is suitable for indicating whether an associated radio receiver is reproducing monophonic or stereophonic program material. The indicator 30 is comprised of two arrays, each array containing a single element. One array is comprised of light emitting diode 31 while the second array consists of light emitting diode 32. When biased in the forward direction, the first LED emits a characteristic visible wavelength of green, whereas the second LED emits a characteristic visible wavelenght of red, when forward biased, The control circuitry is comprised of two electronic switches 33, which couples to reference ground potential 39, 34. The first switch 33 provides a low output state when the radio receiver is tuned to a radio station which is broadcasting in stereo, whereas the second switch 34 provides a high output state when the radio receiver is tuned to a radio station which is broadcasting in monoral. In the example illustrated in FIG. 2, the first switch 33 is contained within the radio's FM multiplex integrated circuit, the switch 33 provided output is located on a terminal 38 of the integrated circuit.

The second switch 34 is comprised of three terminals. The first terminal 35 is a gate terminal whereby for all gate voltages less than a predetermined threshold voltage the impedance between the second terminal 36 and the third terminal 37 is high. For all gate voltages at or exceeding the threshold voltage the impedance between the second terminal 36 and the third terminal 37 is low. In the illustrated example, an NPN transistor is used as the second switch 34, its base identical with the gate terminal 35, its emitter identical with the second terminal 36, and its collector identical with the third terminal 37.

The provided output of the first switch 33 is coupled to the gate terminal 35 of the second switch 34. The second terminal 36 is connected to ground 39; the third terminal 37 is coupled through load resistor 40 to DC bias supply 41. The value of load resistor 40 is chosen to limit the current through the second switch 34, and to LED 32, to a safe level.

The side 30a of indicator 30 which is the common of the cathode of LED 32 and the anode of LED 31 is coupled to the switch provided terminal 38, whereas the side 30b which is the common of the cathode of LED 31 and the anode of the LED 32 is coupled to the third terminal 37 of the second switch 34.

When the radio receiver (not shown) is tuned to a radio station broadcasting in stereo the provided output terminal 38 of the first switch 33 goes low causing the voltage at the gate terminal 35 of the second switch 34 to be below the threshold voltage thereby causing the third terminal 37 to assume a voltage at or near the DC bias supply 41. This creates a first polarity bias across the indicator 30 as the one side 30b is positive with respect to the other side 30a. LED 32 is forward biased causing it to emit light of its characteristic wavelength, i.e., red.

When the radio receiver is tuned to a radio station broadcasting in monoral the provided output terminal 38 of the first switch 33 is high thereby causing the gate terminal 35 of the second switch 34 to exceed the threshold voltage thereby causing the third terminal 37 of the second switch 34 to assume a voltage at or near ground. This creates an opposite polarity bias across the indicator 30 as the one side 30b is negative with respect to the other side 30a. Light emitting diode 31 is forward biasing causing it to emit light of its characteristic wavelength, i.e., green.

Thus, comparing FIG. 2 to FIG. 1, the switches 33, 34 are seen to be series connected in first and second current legs. The first leg extends from the supply 41 through a voltage dropping resistor to the multiplex IC switch 33 and ground potential 39. The second leg extends from the supply 41 through the voltage dropping resistor 40 and through switch 34 to ground potential 39. In operation, when switch 34 is actuated a current path activates LED 31. Otherwise, a separate current path activates LED 32. Thus, the color emitted from the indicator 30 is indicative of which of the two switches 33, 34 is actuated.

Figure 3:
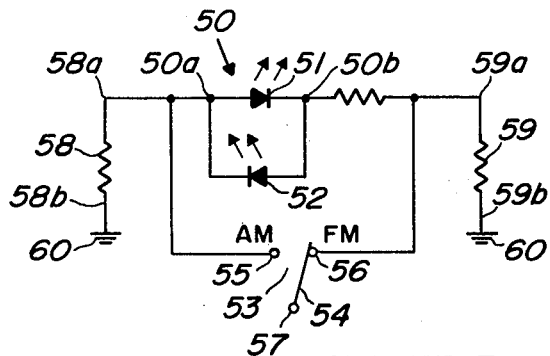
FIG. 3 illustrates a two light emitting diode indicator in an AM/FM indicating system.

The system in FIG. 3 is suitable for indicating whether the radio receiver is operating in the AM or FM mode. The indicator 50, comprised of a first light emitting diode 51 which emits light of a red characteristic visible wavelength when forward biased and a second light emitting diode 52 which emits light of a green characteristic visible wavelenght when forward biased, is identical to the indicator described with respect to FIG. 2, and has first and second terminals 50a (the common of the anode of the first LED 51 and the cathode of the second LED 52) and 50b (the common of the cathode of the first LED 51 and the anode of the second LED 52).

A switch 53, which is ganged to the selector on the radio receiver which allows selection of either an AM or FM mode, has a movable center conductor 54 which is electrically connected to either a first pole 55 or a second pole 56. A DC supply means 57 connects to the movable center conductor 54. The first pole 55 connects to the first indicator terminal 50a; the second pole 56 connects to the second indicator terminal 50b. A pair of resistive components, illustrated as conventional resistors 58, 59 having a predetermined value of resistance when current flows from a first terminal 58a, 59a to a second terminal 58b, 59b are connected such that their second terminals 58b, 59b are connected to circuit ground 60 with the first terminal 58a of the first resistor 58 connected to the first terminal 50a of the indicator 50, and the first terminal 59a of the second resistor 59 connected to the second terminal 50b of the indicator 50.

When the movable center connector 54 of the switch 53 is in contact with the first pole 55 of the switch 53 a current path from the DC supply 57 through the first LED 51 and to ground 60 through the second resistor 59 is created and the first LED 51 is forward biased causing it to emit light of its characteristic wavelength, i.e., red.

When the movable center connector 54 of the switch 53 is in contact with the second pole 56 of the switch 53, a current path from the DC supply 57 through the second LED 52 and to ground 60 through the first resistor 58 is created and the second LED 52 is forward biased causing it to emit light of its characteristic wavelength, i.e., green.

Figure 4:
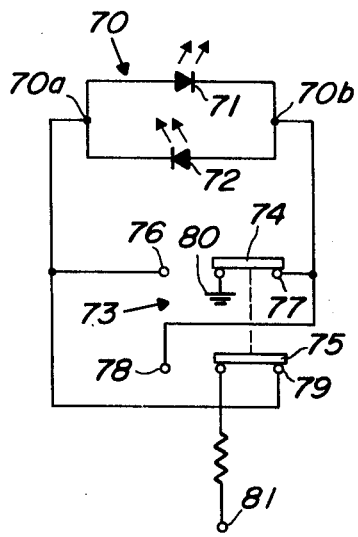
FIG. 4 illustrates alternate circuitry for an AM/FM indicating system.

The system in FIG. 4 is also suitable for indicating whether the radio receiver is operating in the AM or FM mode. The indicator 70, comprised of a first LED 71 which emits light of a red characteristic visible wavelength when forward biased and a second LED 72 which emits light of a green characteristic wavelength when forward biased, is identical to the indicator described with respect to FIG. 2, and has first and second terminals 70a,b (the common of the anode of the first LED 71 and the cathode of the second LED 72) and 70b (the common of the cathode of the first LED 71 and the anode of the second LED 72).

A switch 73, which is ganged to the selector on the radio receiver which allows selection of either an AM or FM mode, has two ganged but electrically isolated movable center connector 74, 75, the first connector 74 making contact to either a first pole 76 or a second pole 77, the second connector 75 simultaneously making contact to either a first pole 78 or a second pole 79 respectively, each pole electrically isolated from all other poles. Center connector 74 and its associated first pole 76 and second pole 77 comprise the first half of the switch 73 whereas center connector 75 and its associated first pole 78 and second pole 79 comprise the second half of the switch 73.

The first center connector 74 is connected to circuit ground 80; the second center connector 75 is coupled to a DC supply 81. The first pole 76 of the first half of the switch 73 and the second pole 79 of the second half of the switch 73 are both connected to the first terminal 70a of the indicator 70; the second pole 77 of the first half of the switch 73 and the first pole 78 of the second half of the switch 73 are both connected to the second terminal 70b of the indicator 70.

When the center connectors 74, 75 are connected to their associated first poles 76, 78, respectively, a current path from the DC supply 81 through the second LED 72 to ground 80 is created and the second LED 72 is forward biased causing it to emit light of its characteristic wavelength, i.e., green.

When the center conductors 74, 75 are connected to their associated second poles 77, 79 respectively, a current path from the DC supply 81 through the first LED 71 to ground 80 is created and the first LED is forward biased causing it to emit light of its characteristic wavelength, i.e., red.

Figure 5:
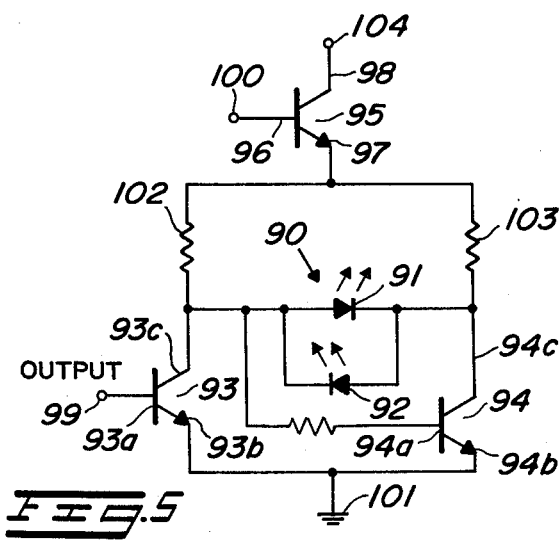
FIG. 5 illustrates a two light emitting diode indicator in a system capable of indicating AM/FM or Stereo/Mono as well as indicating proper receiver tuning.

The system illustrated in FIG. 5 is suitable for indicating whether the radio receiver is in an AM or FM mode, or indicating whether the reproduced radio signal is monophonic or stereophonic, as well as indicating accuracy of receiver tuning.

The indicator 90 which is comprised of a first LED 91 which emits light of a red characteristic wavelength when forward biased and a second LED 92 which emits light of a green characteristic wavelength when forward biased, is identical to the indicator described with respect to FIG. 2, and has a first terminal 90a (the common of the anode of the first LED 91 and the cathode of the second LED 92), and a second terminal 90b (the common of the cathode of the first LED 91 and the anode of the second LED 92).

The control circuitry therefor includes two electronic switches 93, 94 and a voltage controlled current source 95. Each switch 93, 94 is comprised of three terminals. The first terminal 93a and 94a respectively, is a gate terminal whereby for all gate voltages less than a predetermined threshold voltage the impedance between the second terminal, 93b and 94b respectively, and the third terminal, 93c and 94c respectively, is high whereas for all gate voltages at or exceeding the threshold voltage the impedance between the second terminal, 93b-94b, and the third terminal, 93c-94c is low. In the illustrated embodiment NPN transistors are used as the switches 93–94, the gate terminal, 93a–94a, identical with the transistor's base, the second terminal, 93b-94b, identical with the transistor's emitter, and the third terminal, 93c-94c, identical with the transistor's collector.

The gate terminal 93a of the first switch 93 is coupled to a first provided output 99 of the radio receiver. This output assumes a high state or a low state dependent on the desired receiver mode. Thus, the output might be high if the receiver is tuned to an AM station and low if the receiver is tuned to an FM station, or it might be high if the receiver is reproducing a monophonic signal and low if it is reproducing a stereo signal.

The current source has three terminals; the first is a control terminal 96, the second is a current output terminal 97, and the third is a current input terminal 98. The current flowing into the third terminal 98 and out of the second terminal 97 is proportional to the voltage at the control terminal 96. As illustrated, the voltage controlled current source 95 in the preferred embodiment is an NPN transistor having its base identical with the control terminal 96, its emitter identical with the second terminal, and its collector identical with the third terminal 98.

The control terminal 96 of the current source 95 is coupled to a second radio receiver provided control voltage 100, the provided control voltage 100 increasing as the tuner is tuned more precisely to the operating frequency of a radio station.

The second terminals 93b–94b of the switches 93, 94 are both connected to circuit ground 101. The gate terminal 94a of the second switch 94 is coupled to the third terminal 93c of the first switch 93. The third terminal 93c, 94c of each switch 93, 94 is coupled through its corresponding load resistor, 102 and 103 respectively, to the current output terminal 97 of the current source 95. The current input terminal 98 of the current source 95 is connected to a DC supply 104. The first terminal 90a of indicator 90 is connected to the third terminal 93c of the first switch 93; the second terminal 90b of the indicator 90 is connected to the third terminal 94c of the second switch 94.

When the first provided output voltage 99 from the radio receiver is low, the gate terminal 93a of the first switch 93 is low causing the voltage at the third terminal 93c of the first switch 93 to go high as will the voltage at the gate terminal 94a of the second switch 94. This causes the voltage at the third terminal 94c of the second switch 94 to go low whereby a bias voltage of a first polarity, i.e., indicator terminal 90a positive with respect to terminal 90b, is created across the indicator 90. In this first polarity the first LED 91 is forward biased causing it to emit light of a red characteristic wavelength.

When the first provided control voltage 99 is high, the gate terminal 93a of the first switch 93 is high causing the voltage at the third terminal 93c of the switch 93 to go low as will the voltage at the gate terminal 94a of the second switch 94. This causes the voltage at the third terminal 94c of the second switch 94 to go high thereby creating a bias voltage of an opposite polarity, i.e., indicator terminal 90a is negative with respect to terminal 90b, across the indicator 90. In this second polarity the second LED 92 is forward biased causing it to emit light of a green characteristic wavelength.

In either case of the first provided voltage 99 being high or low, the current through the indicator 90 is equal to the current output of the controlled current source 95. When the radio receiver is tuned more precisely to the frequency of the received radio station, the voltage at the second provided output 100 increases thus increasing the control terminal 96 of the current source 95 thereby increasing the current out of the source 95. This increased current passes through the indicator 90 causing it to emit light of a greater intensity. In this manner, the indicator 90 intensity gives an indication of the accuracy of tuning of the radio receiver.

Figure 6:
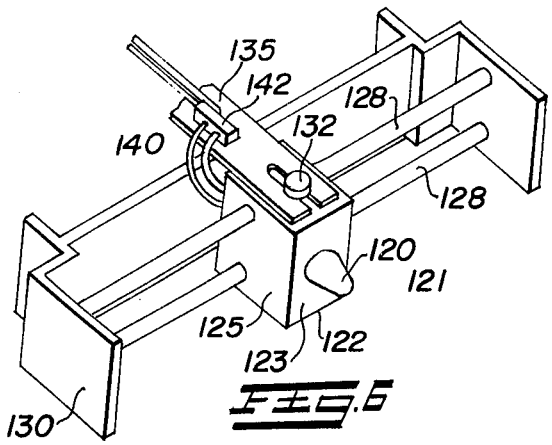
FIG. 6 illustrates mounting an indicator to a radio receiver dial scale pointer.

Mechanical means for mounting an indicator to a tuner pointer is illustrated in FIG. 6. An indicator 120 is housed in a block-shaped carriage 122, the light emitting axis 121 of the indicator is so oriented as to emit light in a general direction perpendicular to a face of the carriage 123 and outward from the carriage 122. The carriage 122 is provided with a pair of parallel slide rod holes which extend between opposing faces of the carriage 122, the longitudinal axis of the holes perpendicular to the indicators light emitting axis 121, and in a general horizontal direction.

The carriage is positioned on a pair of carriage slide rods 128, the rods 128 parallel to each other and extending through the carriage holes and between opposing faces of a dial background assembly 130. The rods 128 constrain the carriage 122 to move in a horizontal direction, the light emitting axis 121 of the indicator 120 thereby constrained in a horizontal plane.

Extending from the utmost horizontal face of the carriage 122 is a lock stud 132, the stud 132 comprising a circular head of relatively large diameter having a cylindrical shaft of relatively small diameter perpendicularly mounted thereto, the end of the shaft opposite the head is attached to a face on the carriage 122, the longitudinal axis of the shaft perpendicular to the light emitting axis 121 of the indicator 120 and the longitudinal axis of the carriage rods 128.

Extending from the radio receiver is tuner pointer arm 135. The arm 135 is controlled to translate in a horizontal plane, in a direction perpendicular to the longitudinal axis of the arm, when the receiver is tuned.

The arm 135 is provided with a slot extending a short distance from the free end of the arm along the arm's longitudinal axis.

In operation, the stud 132 engages the slot, the arm 135 thereby captivated between the face of the carriage 122 and the head of the stud 132, horizontal movement of the arm 135 thereby causing horizontal translation of the carriage 122. Two wire leads 140 extend from the indicator 120 to the top surface of the arm 135 where they are clamped by kick-out clamp 142 and are further routed along the arm to control circuitry in the receiver.

When the entire assembly is mounted behind the dial face of the receiver, the emitted light from the indicator will appear as a source of light on the dial scale, the source moving as the receiver is tuned thereby indicating tuner position.

While specific constructions of the invention have been described it is understood that countless variations are possible, all of which are within the true spirit and scope of the invention.

I claim:
1. A multicolor indicating system comprising:
an indicator having first and second light emitting diodes, each diode emitting light of a different color upon activation, the diodes wired in parallel such that the polarity of the first is opposite the polarity of the second, the common connecting points of the diodes comprising first and second terminals,
power supply means, having first and second contacts, for activating the diodes, the second contact connected to a reference potential,
a first current leg means connectable between the first terminal and the reference potential,
a second current leg means connectable between the second terminal and the reference potential,
control circuitry means operable in a first or a second state, the circuitry completing a circuit from the power supply first contact through the first diode and the first leg to the reference potential in the first state, the circuitry completing a circuit from the power supply first contact through the second diode and the second leg to the reference potential in the second state
whereby the color emitted by the indicator is representative of the state of the control circuitry.
2. The indicating system of claim 1 wherein
the control circuitry provided therefore is comprised of two electronic switches, the first switch series connected in the first current leg, the second switch series connected in the second current leg, voltage dropping means coupling the power supply first contact to the first and second terminals, and means to selectively actuate either one of the switches
whereby an actuated switch completes a current path activating one of the diodes.
3. The indicating system of claim 2 wherein the electronic switches are transistors.
4. The indicating system of claim 2 wherein the voltage dropping means comprises a pair of resistors, each resistor coupling one of the terminals to the power supply first contact.
5. The indicating system of claim 2 in combination with radio receiver circuitry wherein the voltage dropping means comprises a voltage controlled resistance means,
the system further comprising means for varying the voltage applied to the voltage controlled resistance means in response to the accuracy of tuning of the radio circuitry,
whereby the intensity of light emitted from the indicator indicates the accuracy of tuning of the radio circuitry.

6. The indicating system of claim 2 in combination with AM/FM radio receiver circuitry
wherein the means to selectively actuate either one of the switches comprises means actuating the first switch in response to the radio circuitry processing an AM signal, and means actuating the second switch in response to the radio circuitry processing an FM signal,
whereby the color emitted by the indicator indicates either AM or FM operation of the receiver circuitry.

7. The indicating system of claim 6 wherein the voltage dropping means comprises a voltage controlled resistance means,
the system further comprising
means for varying the voltage applied to the voltage controlled resistance means in response to the accuracy of tuning of the radio circuitry.
whereby the intensity of light emitted from the indicator indicates the accuracy of tuning of the radio circuitry.

8. The indicating system of claim 2 in combination with monophonic/stereophonic radio receiver circuitry
wherein the means to selectively actuate either one oof the switches comprises means actuating the first switch in response to the radio circuitry processing a monophonic signal, and means actuating the second switch in response to the radio circuitry processing a stereophonic signal,
whereby the color emitted by the indicator indicates either monophonic or stereophonic operation of the receiver circuitry.

9. The indicating system of claim 8 wherein the voltage dropping means comprises a voltage controlled resistance means,
the system further comprising
means for varying the voltage applied to the voltage controlled resistance means in response to the accuracy of tuning of the radio circuitry,
whereby the intensity of light emitted from the indicator indicates the accuracy of tuning of the radio circuitry.

10. The indicating system of claim 9 wherein the voltage controlled resistance means comprises a transistor.

11. The indicating system of claim 1 wherein the indicator is comprised of a multiplicity of diodes, the multiplicity having a first plurality comprising a first array and a second plurality comprising a second array, all diodes in an array wired in parallel such that all are in the same electrical orientation for simultaneous actuation thereof, the diodes of one array emitting light of a different color from those of another array, the arrays wired in parallel such that the polarity of one is opposite the polarity of the other, and the common connecting points of the arrays comprising the first and second terminals.

12. The indicating system of claim 1 wherein the control circuitry comprises:
a switch having two mechanically ganged but electrically isolated movable center connectors, and four poles, each movable center connector making contact to either a first or a second associated pole dependent on switch position, the first center connector and its first and second poles comprising the first half of the switch, the second center connector and its associated first and second poles comprising the second half of the switch; and
means coupling the first center connector to the reference potential, the second center connector to the first contact of the power supply means, the first pole of the first half of the switch and the second pole of the second half of the switch to the first terminal of the diodes, the second pole of the first half of the switch and the first pole of the second half of the switch to the second terminal of the diodes,
whereby the color emitted by the indicator is indicative of the position of the switch.

13. The indicating system of claim 12 in combination with AM/FM radio receiver circuitry, the combination further comprising means positioning the switch to a first position in response to the radio circuitry processing an AM signal, and positioning the switch to a second position in response to the radio circuitry processing an FM signal
whereby the color emitted by the indicator indicates either AM or FM operation of the radio receiver.

14. The indicating system of claim 1 in combination with a radio receiver, the receiver having a movable carriage whose position is a function of the frequency to which the receiver is tuned,
wherein the system further comprises means for mechanically mounting the indicator to the movable carriage for movement therewith,
whereby the position of the indicator is indicative of the frequency to which the receiver is tuned.

15. The combination of claim 14 wherein the carriage comprises a translucent dial scale pointer and the mounting means aligns the indicator to the pointer whereby the pointer assumes a color dependent on the light emitted by the indicator.

16. The indicating system of claim 1 wherein the control circuitry comprises
a switch having a movable center connector which is connected to either a first or a second pole dependent on switch position,
means coupling the first pole to the first terminal,
means coupling the second pole to the second terminal, and
means coupling the center connector to the first contact of the power supply means,
whereby the color emitted by the indicator is indicative of the position of the switch.

17. The indicating system of claim 16 wherein the first and second current legs are comprised of resistors, each resistor having a resistance value significantly greater than the resistance of an activated diode.

18. The indicating system of claim 16 in combination with AM/FM radio receiver circuitry, the combination further comprising means positioning the switch to a first position in response to the radio circuitry processing an AM signal, and positioning the switch to a second position in response to the radio circuitry processing an FM signal
whereby the color emitted by the indicator indicates either AM or FM operation of the radio receiver.

* * * * *